United States Patent
Ochs et al.

(10) Patent No.: US 9,586,850 B2
(45) Date of Patent: Mar. 7, 2017

(54) METHOD FOR PRODUCING TITANIUM-DOPED SILICA GLASS FOR USE IN EUV LITHOGRAPHY AND BLANK PRODUCED IN ACCORDANCE THEREWITH

(71) Applicant: Heraeus Quarzglas GmbH & Co. KG, Hanau (DE)

(72) Inventors: Stefan Ochs, Gelnhausen (DE); Klaus Becker, Hanau (DE); Stephan Thomas, Grosskrotzenburg (DE)

(73) Assignee: Heraeus Quarzglas GmbH & Co. KG, Hanau (DE)

( * ) Notice: Subject to any disclaimer, the term of this patent is extended or adjusted under 35 U.S.C. 154(b) by 0 days.

(21) Appl. No.: 14/911,506

(22) PCT Filed: Jul. 22, 2014

(86) PCT No.: PCT/EP2014/065686
§ 371 (c)(1),
(2) Date: Feb. 11, 2016

(87) PCT Pub. No.: WO2015/022152
PCT Pub. Date: Feb. 19, 2015

(65) Prior Publication Data
US 2016/0185645 A1    Jun. 30, 2016

(30) Foreign Application Priority Data

Aug. 16, 2013  (DE) .................. 10 2013 108 885

(51) Int. Cl.
C03C 3/06       (2006.01)
C03B 19/14      (2006.01)
G03F 1/60       (2012.01)
C03C 3/00       (2006.01)
C03C 4/00       (2006.01)
G03F 1/52       (2012.01)

(52) U.S. Cl.
CPC ...... *C03B 19/1461* (2013.01); *C03B 19/1453* (2013.01); *C03C 3/00* (2013.01); *C03C 3/06* (2013.01); *C03C 4/0085* (2013.01); *G03F 1/52* (2013.01); *G03F 1/60* (2013.01); *C03B 2201/075* (2013.01); *C03B 2201/12* (2013.01); *C03B 2201/23* (2013.01); *C03B 2201/42* (2013.01); *C03C 2201/12* (2013.01); *C03C 2201/23* (2013.01); *C03C 2201/42* (2013.01); *C03C 2203/46* (2013.01); *C03C 2203/52* (2013.01); *C03C 2204/00* (2013.01)

(58) Field of Classification Search
CPC .... C03C 3/06; C03C 2201/06; C03C 2201/42
USPC ........................................................ 501/54
See application file for complete search history.

(56) References Cited

U.S. PATENT DOCUMENTS

| 3,868,170  | A   |   | 2/1975 | DeLuca |   |
|---|---|---|---|---|---|
| 4,367,013  | A   |   | 1/1983 | Guerder et al. |   |
| 7,419,924  | B2  | * | 9/2008 | Koike | C03B 19/1453 501/54 |
| 8,137,469  | B2  | * | 3/2012 | Hawtof | C03B 19/1423 118/725 |
| 2010/0091360 | A1 | * | 4/2010 | Kuehn | C03B 19/1453 359/355 |

FOREIGN PATENT DOCUMENTS

| DE | 3105295 A1    | 12/1981 |
| EP | 2428488 A1    | 3/2012  |
| JP | S5562822 A    | 5/1980  |
| WO | 2004089836 A1 | 10/2004 |
| WO | 2006004169 A1 | 1/2006  |
| WO | 2009106134 A1 | 9/2009  |
| WO | 2009128560 A1 | 10/2009 |

OTHER PUBLICATIONS

International Search Report issued Sep. 29, 2014 in International Application No. PCT/EP2014/065686.
Nitrous Oxide, Air Liquide, Sep. 22, 2014, downloaded from web page: http://www.airliquide.com/en/company/our-businesses-our-products/other-gases/nitrous-oxide-2.html, Download date: Sep. 22, 2014, original posting date: unknown, 1 page.
Carson et al., "Optical Attenuation in Titania-Silica Glasses," Journal of Non-Crystalline Solids, vol. 11, pp. 368-380 (1973).
Dodd et al., "Optical Determinations of OH in Fused Silica," Communications, p. 3911 (1966).
Saito et al., "Effects of fluorine on structure, structural relaxation, and absorption edge in silica glass," Journal of Applied Physics, vol. 91, No. 8, pp. 4886-4890 (Apr. 15, 2002).

(Continued)

*Primary Examiner* — Noah Wiese
(74) *Attorney, Agent, or Firm* — Panitch Schwarze Belisario & Nadel LLP

(57) ABSTRACT

The $Ti^{3+}$ ions present in Ti-doped silica glass cause a brown staining of the glass, causing inspection of the lens to become more difficult. Known methods for reducing $Ti^{3+}$ ions in favor of $Ti^{4+}$ ions in Ti-doped silica glass include a sufficiently high proportion of OH-groups and carrying out an oxygen treatment prior to vitrification, which both have disadvantages. In order to provide a cost-efficient production method for Ti-doped silica glass, which at a hydroxyl group content of less than 120 ppm shows an internal transmittance (sample thickness 10 mm) of at least 70% in the wavelength range of 400 nm to 1000 nm, the $TiO_2$—$SiO_2$ soot body is subjected to a conditioning treatment with a nitrogen oxide prior to vitrification. The blank produced in this way from Ti-doped silica glass has the ratio $Ti^{3+}/Ti^{4+} \leq 5 \times 10^{-4}$.

16 Claims, No Drawings

(56) References Cited

OTHER PUBLICATIONS

International Preliminary Report on Patentability issued Feb. 25, 2016 in International Application No. PCT/EP2014/065686.

* cited by examiner

METHOD FOR PRODUCING TITANIUM-DOPED SILICA GLASS FOR USE IN EUV LITHOGRAPHY AND BLANK PRODUCED IN ACCORDANCE THEREWITH

CROSS-REFERENCE TO RELATED APPLICATIONS

This application is a Section 371 of International Application No. PCT/EP2014/065686, filed Jul. 22, 2014, which was published in the German language on Feb. 19, 2015 under International Publication No. WO 2015/022152 A1 and the disclosure of which is incorporated herein by reference.

BACKGROUND OF THE INVENTION

In EUV lithography, highly integrated structures with a line width of less than 50 nm are produced by microlithographic projection devices. Use is here made of laser radiation from the EUV range (extreme ultraviolet light, also called soft X-ray radiation) with wavelengths of about 13 nm. The projection devices are equipped with mirror elements, which consist of titanium dioxide-doped glass having a high silicic acid content (hereinafter also referred to as "Ti-doped silica glass") and are provided with a reflective layer system. These materials are distinguished by an extremely low coefficient of thermal expansion, so that they do not deform due to heating during the exposure process, which would lead to a deterioration of the imaging quality.

Ti-doped silica glass is produced by flame hydrolysis, starting from silicon- and titanium-containing precursor substances. A porous soot body of titanium-doped $SiO_2$ is first produced and is vitrified into a dense glass body after drying for reducing the hydroxyl group content (OH content). However, due to a more or less strong concentration of $Ti^{3+}$ ions in the glass matrix, the doping process with titanium oxide results in a brownish coloration of the glass. The moldings for this application, hereinafter also called blanks, are large, dark-brown plates with dimensions of up to about $70\times60\times20$ cm$^3$, which must be checked for their optical properties and/or for defects caused by the manufacturing process or for inhomogeneities. The brownish coloration of the glass has been found to be problematic because optical measurement methods that require transparency in the visible spectral range can thus be used only to a limited degree or not at all.

The literature has proposed various solutions for restricting the amount of the $Ti^{3+}$ ions in favor of $Ti^{4+}$ ions by way of an oxidation treatment. When a Ti-doped silica glass with a relatively high hydroxyl group content is used, the OH groups permit the desired oxidation of $Ti^{3+}$ into $Ti^{4+}$. This is described by Carson and Maurer in "Optical Attenuation in Titania-Silica Glasses", *J. Non-Crystalline Solids*, Vol. 11(1973), pp. 368-380, wherein a reaction according to formula $2Ti^{3+}+2OH^-\rightarrow 2Ti^{4+}+2O^{2-}+H_2$ is indicated. In a corresponding thermal treatment, the OH groups contained in the Ti-doped soot body oxidize the $Ti^{3+}$ ions into $Ti^{4+}$ ions, with the resulting hydrogen diffusing out of the porous soot body.

This procedure is adopted in EP 2 428 488 A1, particularly with a view to optimized conditions for the process regarding oxidation and out-diffusion of the hydrogen. The Ti-doped silica glass disclosed in EP 2 428 488 A1 has a high OH content of more than 600 wt. ppm and a relatively low hydrogen content (less than $2\times10^{17}$ molecules/cm$^3$). To ensure a high OH content, it is recommended that water vapor should be added during deposition. The amount of $Ti^{3+}$ ions is indicated to be less than 3 ppm.

WO 2004/089836 A1 discloses a Ti-doped silica glass with fluorine codoping that shows a very flat curve of the thermal expansion coefficient over a relatively wide temperature range. First of all, the porous $TiO_2$—$SiO_2$ soot body is pre-dried in air at 1200° C.; this entails a first reduction of the OH content and an oxidation of $Ti^{3+}$ ions. Subsequently, for fluorine doping the $TiO_2$—$SiO_2$ soot body is exposed to an atmosphere with 10% by vol. of $SiF_4$ at 1000° C. for several hours. Apart from fluorine doping, this treatment also entails a further reduction of the OH content. To prevent any dark coloration during vitrification of the soot body, it is suggested according to WO 2004/089836 A1 that the soot body should be treated in an oxygen atmosphere in the temperature range between 300° C. and 1300° C. for several hours before the vitrification step is subsequently carried out.

Similarly, WO2006/004169 A1 also suggests an oxygen treatment of a $TiO_2$—$SiO_2$ soot body with F codoping prior to vitrification so as to prevent any dark coloration due to reduction of $TiO_2$. The Ti-doped silica glass produced in this way contains 10 wt. ppm OH groups and 12 wt. ppm $Ti^{3+}$ ions at a fluorine content of 6300 wt. ppm.

WO2009/128560 A1 starts from a $SnO_2$—$TiO_2$—$SiO_2$ glass which, like the Ti-doped silica glass, is also distinguished by a thermal expansion coefficient of zero. Tin and also other elements mentioned in WO2009/128560 A1 act as a so-called $Ti^{3+}$ inhibitor. A precondition is, however, that the tin is at least predominantly present as $Sn^{4+}$ ion or as $SnO_2$. That is, when a relevant amount of $Sn^{2+}$ is present, the desired effect with respect to a reduction of the concentration of $Ti^{3+}$ ions cannot be observed. Rather, $Sn^{2+}$ additionally contributes to the absorption in the visible wavelength range. On the other hand, an excessive amount of $Sn^{4+}$ ions entails the risk of crystalline $SnO_2$ depositions. All in all, the $SnO_2$—$TiO_2$—$SiO_2$ glass must therefore be set very accurately in its composition, which makes its production complicated. WO2009/128560 A1 therefore suggests an oxygen treatment of the corresponding soot body prior to vitrification also for this glass.

In summary, it should be noted that according to the prior art, the reduction of $Ti^{3+}$ ions in favor of $Ti^{4+}$ ions in Ti-doped silica glass is ensured by a sufficiently large amount of OH groups, whereby an internal oxidation takes place with out-diffusion of hydrogen, or at a low OH group content an oxygen treatment is needed prior to vitrification, which oxygen treatment requires a high treatment temperature and special corrosion-resistant furnaces and is thus expensive.

BRIEF SUMMARY OF THE INVENTION

The present invention refers to a method for producing a blank of titanium-doped glass having a high silicic-acid content with an internal transmission of at least 70% in the wavelength range of 400 nm to 1000 nm at a sample thickness of 10 mm for use in EUV lithography, comprising the following method steps:

(a) producing a $TiO_2$—$SiO_2$ soot body by flame hydrolysis of silicon- and titanium-containing precursor substances, (b) drying the soot body to obtain a mean hydroxyl group content of less than 120 wt. ppm, and (c) vitrifying the soot body to form a blank of titanium-doped glass having a high silicic-acid content.

Furthermore, the present invention refers to a blank of titanium-doped silica glass produced according to this method for use in EUV lithography with a $TiO_2$ content in the range of 6% by wt. to 12% by wt., wherein the titanium is present in the oxidation forms $Ti^{3+}$ and $Ti^{4+}$, and with a mean hydroxyl group content of less than 120 wt. ppm,

DETAILED DESCRIPTION OF THE INVENTION

It is an object of the present invention to provide an inexpensive production method for titanium-doped glass with a high silicic-acid content, which glass at a hydroxyl group content of less than 120 ppm shows an internal transmission at a sample thickness of 10 mm of at least 70% in the wavelength range of 400 nm to 1000 nm. Furthermore, it is an object of the present invention to provide such a Ti-doped silica glass blank.

This objective is achieved according to the invention in that that prior to vitrification according to method step (c), the $TiO_2$—$SiO_2$ soot body is subjected to a conditioning treatment which comprises a treatment with a nitrogen oxide.

In the production of synthetic, Ti-doped silica glass according to the so-called "soot method" by flame hydrolysis, $SiO_2$ and $TiO_2$ particles produced in the flame by hydrolysis or oxidation are first deposited with formation of a $TiO_2$—$SiO_2$ soot body on a deposition surface. It is only in a further method step that this soot body is vitrified into doped, dense Ti-doped silica glass. Usually, a drying or dehydration treatment is carried out prior to vitrification to remove the accumulated water, so that the formation of bubbles during vitrification can be ruled out. Due to the manufacturing process, Ti-doped silica glass produced in this way exhibits hydroxyl group contents in the range of a few ppm by weight to 300 ppm by weight.

As an alternative to the "soot method" according to the invention, Ti-doped silica glass can also be produced according to the single-stage "direct method," in which the deposited $SiO_2$ and $TiO_2$ particles are directly vitrified, wherein typically an increased OH content in the range of about 450-1,200 wt. ppm is set. The Ti-doped silica glass produced according to the direct method is not the subject of the invention.

The gist of the method according to the invention consists in reducing the concentration of $Ti^{3+}$ ions prior to vitrification—in favor of $Ti^{4+}$—in the $TiO_2$—$SiO_2$ soot body by way of a thermal-oxidative conditioning treatment with a nitrogen oxide. The conditioning treatment is carried out preferably directly before the vitrification step, but it is basically also possible to carry out the conditioning treatment with the nitrogen oxide prior to the drying of the soot body. The Ti-doped silica glass to be produced according to the method according to the invention contains titanium dioxide in the range of 6% by wt. to 12% by wt., which corresponds to a titanium content of 3.6% by wt. to 7.2% by wt. In the $TiO_2$—$SiO_2$ soot body, the titanium is at least partly present in the oxidation form $Ti^{3+}$. It is desired that all $Ti^{3+}$ ions are converted, if possible, into $Ti^{3+}$ ions, so that no objectionable absorption is observed in the wavelength range of 400 nm to 1,000 nm due to $Ti^{3+}$ ions and the Ti-doped silica glass thus shows maximum transparency in this wavelength range.

Since the soot body with less than 120 wt. ppm shows a small proportion of OH groups, these are hardly helpful in the oxidation of $Ti^{3+}$ to $Ti^{4+}$. Instead, nitrogen oxides are used according to the invention as the oxidative treatment reagent; these nitrogen oxides also reacting with $Ti^{3+}$ ions at a relatively low temperature. Owing to the conditioning treatment with nitrogen oxides, the technically and energetically complicated high-temperature treatment of the $TiO_2$—$SiO_2$ soot body in an oxygen atmosphere, as is known from the prior art, is not required. Therefore, with the method according to the invention, it is possible to carry out the conditioning treatment in a graphite furnace which is also used for the drying and vitrification of the soot body in vacuum or/and in a noble gas. The conversion of the soot body in an oxygen-resistant furnace, as is required in the prior art, is not needed. The method according to the invention is thus particularly efficient.

The hydroxyl group content (OH content) is obtained by measuring the IR absorption according to the method of D. M. Dodd et al. ("Optical Determinations of OH in Fused Silica," (1966), p. 3911).

Suitable method modifications for the treatment with nitrogen oxides are explained in more detail hereinafter.

It has been found that nitrous oxide ($N_2O$), also called "laughing gas," is particularly advantageously used as nitrogen oxide for the conditioning treatment. Nitrous oxide offers the special advantage that it is available in high purity on a large technical scale and is relatively nontoxic and safe. In the thermal decomposition of nitrous oxide, very reactive nitrogen and oxygen atoms are formed that react with the $Ti^{3+}$ ions already at room temperature. The low treatment temperature permits the use of furnaces of a comparatively simple construction that may, for instance, also contain furnace parts of graphite.

As an alternative to nitrous oxide, nitrogen dioxide ($NO_2$) may also be used; it also releases very reactive nitrogen and oxygen atoms during thermal decomposition.

The reaction of $Ti^{3+}$ ions with nitrous oxide or nitrogen dioxide is carried out according to the following reaction equations (1) and (2) with release of nitrogen ($N_2$):

$$2Ti^{3+} + N_2O \rightarrow 2Ti^{4+} + O^{2-} + N_2 \qquad (1)$$

$$8Ti^{3+} + 2NO_2 \rightarrow 8Ti^{4+} + 4O^{2-} + N_2 \qquad (2)$$

It has turned out to be useful to carry out the conditioning treatment with nitrogen oxide at a treatment temperature in the range of 20° C. to 600° C., preferably in the range of 20° C. to 500° C., and for a period of at least one hour.

Since the conditioning treatment can already be performed at room temperature (20° C. to about 25° C.) without the use of a heater, oxidation of the $Ti^{3+}$ ions with a comparatively small energy input is possible. If at all, only the use of furnaces of a rather simple construction is thus required. It is therefore also possible to repeat the thermal conditioning treatment in nitrogen oxide-containing atmosphere by repeated running through this treatment phase. At temperatures below approximately 600° C., the porous structure of the soot body is maintained, so that it is ensured that the gaseous treatment reagents can pass through the soot body by way of diffusion and can uniformly react with the $Ti^{3+}$ ions distributed in the glass network. A so-called "cold infiltration" with the nitrogen oxide-containing gas is carried out at room temperature, so that with a correspondingly long treatment duration the desired oxidative reaction with $Ti^{3+}$ ions takes place. A faster reaction can be achieved in the treatment with nitrogen oxide when the process is carried out in the range of the specific decomposition temperature of the nitrogen oxide used. As a rule, the decomposition reactions take place starting from a temperature of about 150° C. Depending on the treatment temperature, the treatment period also depends on the volume of the soot body. A minimum treatment duration of at least one hour has turned out to be useful to ensure an efficient infiltration of the soot body with the nitrogen oxide. A substantially uniform distribution of the treatment gas within the porous soot body is achieved in this process. The nitrogen oxide is here preferably introduced into the soot body by an inert carrier gas stream.

Advantageously, the amount of the nitrogen oxide-containing gas in the inert gas during the conditioning treatment is between 0.1 and 20% by volume, preferably between 5 and 10% by volume.

Nitrogen oxide contents below 0.1% by volume show a low oxidative effect, and nitrogen oxide proportions above 20% by volume may lead to an overloading with nitrogen and to the formation of bubbles, which results therefrom, in the subsequent treatment at a high temperature, as for instance during vitrification.

To ensure a complete expulsion of the molecular gas-like nitrogen evolving during the oxidation of $Ti^{3+}$ to $Ti^{4+}$ and of other possible reaction gases out of the soot body, it is advantageous to carry out a thermal treatment in a temperature range of 600° C. to 1,000° C. after the conditioning treatment with the nitrogen oxide and prior to the vitrification according to method step (c).

Nitrogen oxide is no longer supplied in this process; it is rather advantageous to apply a negative pressure of about $10^{-1}$ mbar or below. If this thermal after-treatment is not carried out and if, after the conditioning treatment, heating to the vitrification temperature is immediately carried out at a high heating-up rate, there is the risk of the formation of bubbles due to nitrogen that has not diffused out.

A further advantageous development of the invention involves performing a doping treatment of the $TiO_2$—$SiO_2$ soot body in a fluorine-containing atmosphere that preferably takes place prior to the conditioning treatment with a nitrogen oxide.

The $TiO_2$—$SiO_2$ soot body is thereby doped with fluorine. Fluorine has an impact on the structural relaxation of silica glass, so that for the Ti-doped silica glass it is possible to reduce the fictive temperature as a measure of the state of order of the "frozen" glass network and to extend the temperature range with a thermal expansion coefficient of zero. This is, e.g., known from the *Journal of Applied Physics*, Vol. 91 (8), April 2002, pp. 4886-480. Although the doping treatment is preferably carried out prior to the conditioning treatment, a reverse sequence is also possible as long as the doping treatment does not again increase the minimized $Ti^{3+}$ concentration achieved by the conditioning treatment. Depending on the treatment duration and temperature, a fluorine concentration between 1,000 wt. ppm and 10,000 wt. ppm, preferably between 6,500 wt. ppm and 10,000 wt. ppm, is set.

A particularly economic procedure is achieved when the drying according to method step (b) is carried out fully or in part in the doping treatment.

Thus the dehydration of the soot body and the fluorine doping can be carried out at the same time, which shortens the time of the whole manufacturing method without loss of efficiency.

Moreover, it is advantageous if the doping treatment is carried out in a fluorine-containing atmosphere in a temperature range of 20° C. to not more than 1,000° C. In a doping treatment in this temperature range the porous soot body is highly permeable to the fluorine-containing treatment gas. Moreover, only a small heat supply—if at all—is required for ensuring an incorporation of fluorine into the glass network.

It has turned out to be useful when an inert gas atmosphere with 10-100% by volume of $SiF_4$ is used as the fluorine-containing atmosphere. Instead of $SiF_4$, also pure fluorine gas ($F_2$) or $SiHF_3$ or $SiH_2F_2$ can be used as a rule.

The use of carbon-containing fluorinating gases, such as $CHF_3$, $CF_4$, $C_2F_6$ or $C_3F_8$, is rather disadvantageous due to their reducing effect, as this would support the formation of undesired $Ti^{3+}$ ions.

As for the blank of Ti-doped silica glass, the above-mentioned object starting from a blank of the aforementioned type is achieved according to the invention in that in the Ti-doped silica glass the ratio of $Ti^{3+}/Ti^{4+}$ is less than or equal to $5\times10^{-4}$.

The blank according to the invention shows a high transparency in the wavelength range of 400 nm to 1000 nm due to its small amount of $Ti^{3+}$ ions. The blank can thus be inspected without difficulty with standard optical measuring methods. The doping with $TiO_2$ is in the range of 6% by wt. to 12% by wt.; the OH content is less than 120 wt. ppm.

The concentration of $Ti^{3+}$ can be determined by an electron spin resonance measurement, as is for instance mentioned in the publication by Carson and Maurer in "Optical Attenuation In Titania-Silica Glasses", *J. Non-Crystalline Solids*, Vol. 11(1973), pp. 368-380.

Advantageously, the blank consisting of Ti-doped silica glass has been doped with fluorine. In the sense of a particularly flat profile of the thermal expansion coefficient of zero over a temperature range of 20° C. to 50° C., fluorine doping is in the range of 1,000 wt. ppm to 10,000 wt. ppm, preferably in the range of 6,500 wt. ppm to 10,000 wt. ppm.

The mean fluorine concentration is normally determined by a wet-chemical process. A measurement sample of the blank according to the invention is first dissolved in aqueous NaOH solution. The F concentration is obtained by measurement of the electromotive force of the dissolved measurement sample by a fluorine-sensitive electrode.

The blank produced according to the method of the invention is ideally suited for use in EUV lithography, partly because its transparency in the visible spectral range allows an optimal inspection prior to further processing steps, for instance into a mirror substrate.

The invention shall now be explained in more detail with reference to the following examples.

Example 1

A soot body is produced by flame hydrolysis of octamethylcyclotetra-siloxane (OMCTS) and titanium-isopropoxide [$Ti(OPr^i)_4$] on the basis of the known "outside vapor deposition" (OVD) method. The soot body consists of synthetic silica glass which is doped with 8% by wt. of $TiO_2$.

The soot body is dried at a temperature of 1,100° C. in a heating furnace with a heating element of graphite in vacuum. The graphite existing in the heating furnace effects the adjustment of reducing conditions, which increases the amount of $Ti^{3+}$ ions in the soot body. Upon completion of the dehydration treatment after 50 hours, the hydroxyl group content of the soot body is about 15 wt. ppm.

The thermally dried $TiO_2$—$SiO_2$ soot body is subsequently treated at a temperature in the range of 450° C. to 600° C. in a $N_2O$-containing atmosphere (laughing gas atmosphere). The soot body is first subjected to a thermal treatment with the nitrous oxide or laughing gas in a carrier gas stream consisting of nitrogen at a temperature of 450° C. for 50 hours and the temperature is raised from 450° C. to 600° C. while maintaining the $N_2O/N_2$ gas stream. The laughing gas concentration is set to 5% by volume during this pretreatment phase.

The dried and after-treated $TiO_2$—$SiO_2$ soot body is subsequently vitrified in a sintering furnace at a temperature of about 1400° C. in helium or in vacuum (at about $10^{-2}$ bar) into a transparent Ti-doped silica glass blank. This blank is subsequently homogenized by thermal mechanical homogenization (twisting) and formation of a Ti-doped silica glass blank.

This is followed by a further forming process into a cylindrical shaped body. The blank is put into a melt mold of graphite that has a bottom with a round cross-section and an outer diameter of 300 mm. For the deformation the whole melt mold with the blank contained therein is first heated to 1250° C., subsequently with a ramp of 9° C./min to 1600° C., and thereafter with a ramp of 2° C./min to a temperature of 1680° C. The silica glass mass is kept at that temperature for a time so long that the softened Ti-doped silica glass flows out under the action of its own weight into the bottom of the melt mold, thereby filling the mold. A round plate with a diameter of 300 mm and a thickness of about 60 mm is thereby formed from the blank, said plate being free of layers and striae in all of the three viewing directions.

To reduce mechanical stresses and to mitigate birefringence, the Ti-doped silica glass blank is subjected to an annealing treatment, in which the cylindrical blank is heated for a holding time of 8 hours in air and at atmospheric pressure to 1100° C. and is subsequently cooled down at a cooling rate of 4° C./h to a temperature of 950° C. and is kept at that temperature for 4 hours. Cooling to 300° C. is subsequently carried out at a higher cooling rate of 50° C./h, whereupon the furnace is switched off and the blank is allowed to cool freely in the furnace.

Since the blank in its peripheral regions shows a relatively strong stress birefringence, a part of the overdimension in relation to the component contour is removed from the faces, namely a thickness of 3 mm. The blank is distinguished by high transparency in the visible spectral range due to a ratio $Ti^{3+}/Ti^{4+}$ of $6\times10^{-5}$ and can now be inspected with the standard optical measuring methods and subjected to further processing steps according to the resulting measurement results. The internal transmission is 80%, measured on a sample with a thickness of 10 mm. Internal transmission designates the transmission over the sample thickness, corrected by the amount of the surface losses.

Example 2

Another blank of Ti-doped silica glass is produced as described above with reference to Example 1, with the difference that, instead of nitrous oxide ($N_2O$, laughing gas), nitrogen oxide ($NO_2$) is used as the oxidizing agent.

For this purpose, the $TiO_2$—$SiO_2$ soot body is treated after drying in a nitrogen dioxide atmosphere. $NO_2$ is formed in situ from a mixture of NO and $O_2$, wherein these gases are introduced in a carrier gas stream of nitrogen into a treatment furnace at a temperature of 150° C. and act there on the soot body. After a treatment period of four hours, the temperature is raised to 400° C. and the sample is treated at that temperature for 40 hours, so that the nitrogen dioxide concentration is set to 5% by volume.

Above 200° C., $NO_2$ decomposes into oxygen and reactive nitrogen atoms or compounds that are able to oxidize $Ti^{3+}$ in the glass network structure into $Ti^{4+}$ ions.

The dried and treated $TiO_2$—$SiO_2$ soot body is sintered and homogenized, as described with reference to Example 1. The blank obtained thereafter is substantially free of $Ti^{3+}$ ions; the hydroxyl group content is 15 wt. ppm.

Example 3

In a modification of the production method, as described with reference to Example 1, the $TiO_2$—$SiO_2$ soot body is subjected after the drying step to a doping treatment in an atmosphere containing 20% by vol. $SiF_4$.

This treatment is carried out at a temperature of 900° C. and for a period of 10 h. This leads to a firm incorporation of fluorine into the $TiO_2$—$SiO_2$ soot body to be vitrified. A treatment duration of 35 hours was used for the subsequent oxidation treatment in a nitrogen oxide-containing atmosphere (5% by volume of $N_2O$) at a temperature of 400° C.

Thereafter the soot body is vitrified and further treated, as described with reference to Example 1. The Ti-doped silica glass cylinder obtained in this way is substantially free of $Ti^{3+}$ ions, and it is distinguished by a mean fluorine content of 8940 wt. ppm and by a hydroxyl group content below the detection limit (<1 wt. ppm).

Example 4

Example 4 refers to a variant of Example 3 with fluorine codoping of the $TiO_2$—$SiO_2$ soot body in combination with the drying step. Hence, the $TiO_2$—$SiO_2$ soot body is first not subjected to a thermal drying process, but the soot body is treated after deposition directly with a fluorine-containing atmosphere of $N_2/SiF_4$ at 1000° C. The proportion by volume of $SiF_4$ in the inert gas ($N_2$) is 10% by volume. The treatment is carried out for 10 hours. This is followed by a treatment with laughing gas ($N_2O$) and then by vitrification and homogenization as described in Example 1.

The Ti-doped silica glass cylinder obtained in this way is substantially free of $Ti^{3+}$ ions, and it is distinguished by a mean fluorine content of 6,700 wt. ppm and by a hydroxyl group content below the detection limit (<1 wt. ppm).

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A method for producing a blank of titanium-doped glass having a high silicic-acid content with an internal transmission of at least 70% in the wavelength range of 400 nm to 1000 nm at a sample thickness of 10 mm for use in EUV lithography, comprising the following steps:
   (a) producing a $TiO_2$—$SiO_2$ soot body by flame hydrolysis of silicon- and titanium-containing precursor substances,
   (b) drying the soot body to obtain a mean hydroxyl group content of less than 120 wt. ppm, and
   (c) vitrifying the soot body to form a blank of titanium-doped glass having a high silicic-acid content,
wherein prior to step (c) the $TiO_2$—$SiO_2$ soot body is subjected to a conditioning treatment which comprises a treatment with a nitrogen oxide at a treatment temperature in the range of 20° C. to 600° C. for a period of at least one hour.

2. The method according to claim 1, wherein the conditioning treatment is carried out with nitrous oxide ($N_2O$) as the nitrogen oxide.

3. The method according to claim 1, wherein the conditioning treatment is carried out with nitrogen dioxide ($NO_2$) as the nitrogen oxide.

4. The method according to claim 1, wherein the conditioning treatment comprises a treatment with an inert gas comprising between 0.1 and 20% by vol nitrogen oxide.

5. The method according to claim 1, further comprising performing a doping treatment of the $TiO_2$—$SiO_2$ soot body in a fluorine-containing atmosphere.

6. The method according to claim 5, wherein step (b) is performed fully or partially during the doping treatment.

7. The method according to claim 5, wherein the doping treatment is performed in a temperature range of 20° C. to not more than 1000° C.

8. The method according to claim 5, wherein the fluorine-containing atmosphere during the doping treatment contains an inert gas atmosphere with 10% by vol. to 100% by vol. of $SiF_4$.

9. A method for producing a blank of titanium-doped glass having a high silicic-acid content with an internal transmission of at least 70% in the wavelength range of 400 nm to 1000 nm at a sample thickness of 10 mm for use in EUV lithography, comprising the following steps:
  (a) producing a $TiO_2$—$SiO_2$ soot body by flame hydrolysis of silicon- and titanium-containing precursor substances,
  (b) drying the soot body to obtain a mean hydroxyl group content of less than 120 wt. ppm, and
  (c) vitrifying the soot body to form a blank of titanium-doped glass having a high silicic-acid content, wherein prior to step (c) the $TiO_2$—$SiO_2$ soot body is subjected to a conditioning treatment which comprises a treatment with a nitrogen oxide,
  further comprising performing a thermal treatment at a temperature range of 600° C. to 1000° C. after the conditioning treatment and before step (c) for expulsion of reaction gases from the soot body.

10. The method according to claim 9, wherein the conditioning treatment is carried out with nitrous oxide ($N_2O$) as the nitrogen oxide.

11. The method according to claim 9, wherein the conditioning treatment is carried out with nitrogen dioxide ($NO_2$) as the nitrogen oxide.

12. The method according to claim 9, wherein the conditioning treatment comprises a treatment with an inert gas comprising between 0.1 and 20% by vol nitrogen oxide.

13. The method according to claim 9, further comprising performing a doping treatment of the $TiO_2$—$SiO_2$ soot body in a fluorine-containing atmosphere.

14. The method according to claim 13, wherein step (b) is performed fully or partially during the doping treatment.

15. The method according to claim 13, wherein the doping treatment is performed in a temperature range of 20° C. to not more than 1000° C.

16. The method according to claim 13, wherein the fluorine-containing atmosphere during the doping treatment contains an inert gas atmosphere with 10% by vol. to 100% by vol. of $SiF_4$.

\* \* \* \* \*